United States Patent [19]

Schweitzer

[11] 4,288,743

[45] Sep. 8, 1981

[54] FAULT INDICATOR OPERABLE FROM A REMOTE EXCITATION SOURCE THROUGH A UNIFORMLY DISTRIBUTED IMPEDANCE CABLE

[76] Inventor: Edmund O. Schweitzer, 1002 Dundee Rd., Northbrook, Ill. 60118

[21] Appl. No.: 949,656

[22] Filed: Oct. 10, 1978

[51] Int. Cl.³ .................. G01R 19/165; G01R 31/02; H02H 9/00; H01C 7/00
[52] U.S. Cl. .................................... 324/127; 324/51; 324/133; 338/214; 361/58
[58] Field of Search ................. 324/127, 51, 133, 129; 174/74 R, 74 A; 338/211, 214, 225, 258; 361/10, 58; 123/148 P; 328/259; 339/28, 29

[56] References Cited

U.S. PATENT DOCUMENTS

| | | | |
|---|---|---|---|
| 2,563,952 | 8/1951 | Nichol | 123/148 P |
| 2,790,053 | 4/1957 | Peterson | 338/214 XR |
| 3,166,688 | 1/1965 | Rowand et al. | 338/214 UX |
| 3,367,851 | 2/1968 | Filreis et al. | 338/211 UX |
| 3,448,323 | 6/1969 | Owens | 315/1 |
| 3,518,606 | 6/1970 | Barker | 338/214 X |
| 3,614,422 | 10/1971 | Matsui | 328/259 X |
| 3,676,740 | 7/1972 | Schweitzer | 324/133 X |
| 3,680,071 | 7/1972 | Burgoon | 324/133 X |
| 3,742,247 | 6/1973 | Sunstein | 361/10 X |
| 3,863,145 | 1/1975 | Kelly et al. | 324/133 X |
| 3,906,477 | 9/1975 | Schweitzer | 324/133 |
| 3,970,932 | 7/1976 | Harvey | 324/133 |
| 4,086,529 | 4/1978 | Schweitzer | 324/127 |

FOREIGN PATENT DOCUMENTS 547481 8/1942 United Kingdom ............... 338/214

Primary Examiner—Gerard R. Strecker
Attorney, Agent, or Firm—Lockwood, Dewey, Alex & Cummings

[57] ABSTRACT

A fault indicator for indicating the occurrence of a fault current in an electrical conductor includes a reset circuit operable from an external electrical excitation source. The external source is connected to the reset circuit by a cable formed from a flexible electrically insulating tubing segment within the lumen of which an electrically conductive coating is disposed. The resulting high impedance electrical interconnection reduces the danger of electrical shock from inadvertant contact with the cable or the fault indicator circuitry, and precludes the source from being adversely affected should the cable become shorted to ground.

17 Claims, 8 Drawing Figures

FAULT INDICATOR OPERABLE FROM A REMOTE EXCITATION SOURCE THROUGH A UNIFORMLY DISTRIBUTED IMPEDANCE CABLE

BACKGROUND OF THE INVENTION

The present invention relates generally to current sensing devices for electrical systems, and more particularly to automatically resettable alternating current fault indicators.

With the increased use of underground electrical distribution systems wherein primary and secondary feeder cables are directly buried in the ground, the need has arisen for an improved detection apparatus for determining the location of a short circuit or fault in the system cables or associated electrical components. Since the cables are buried, it is often difficult to determine the exact location of a fault, particularly where there are several distribution transformers, each serving multiple customers.

Cables of the type used in underground distribution systems generally consist of a central conductor covered by an insulating layer and an electrically conductive rubber ground sheath. Detection of fault currents in such cables is most readily accomplished by means of clamp-on type fault indicators, such as those manufactured by E. O. Schweitzer Manufacturing Co. of Mundelien, Illinois. Such fault indicators may be either of the manually reset type, wherein it is necessary that the indicator be physically reset following each fault, or of the automatically reset type, wherein a fault indication is reset upon restoration of line current. Examples of such manually and automatically reset fault indicators are found in U.S. Pat. Nos. 4,086,529, 3,676,740 and 3,906,477, of the present inventor. of the two types of fault indicators, the automatically reset type is better adapted for use in underground distribution systems in that it is not necessary to gain access to the fault indicator following a fault.

One drawback of self-resetting clamp-on type fault indicators is that they require a source of excitation for powering their automatic reset circuitry. Heretofore, this has been provided by either an inductive coupling to the conductor in which current is being sensed, or by means of a connection to an appropriate external excitation source associated with the distribution system, such as the secondary winding of a distribution transformer. The advantage of the interconnection method over the induction method is that the power derived by the fault indicator is not dependent on current flow in the conductor. Unfortunately, the use of a metallic connection for this purpose would subject the distribution system to being short-circuited should the wire connection be damaged or otherwise grounded. Moreover, a lineman inspecting or servicing the fault detector would be subject to the danger of electric shock should he inadvertantly come into contact with the metallic connection or the interior circuitry of the fault detector.

Accordingly, it is a general object of the present invention to provide a new and improved interconnection means for a resettable fault indicator whereby the fault indicator can be energized from an external power source without the danger of electric shock or introducing an electrical short circuit to the system.

SUMMARY OF THE INVENTION

The invention is directed to a fault indicator of the type operable from a source of external electrical excitation, wherein a cable provided for connecting the fault indicator to the excitation source comprises a hollow nonelectrically conductive tubing segment which extends from the fault indicator at one end to the excitation source at the other end, means comprising an electrically conductive coating within the lumen of the tubing segment for providing a high impedance electrical path within the tubing, and means for connecting the coating to the fault indicator at the one end, and to the excitation source at the other end, whereby the fault indicator is energized by the external source through the cable.

BRIEF DESCRIPTION OF THE DRAWINGS

The features of the present invention, which are believed to be novel, are set forth with particularity in the appended claims. The invention, together with the further objects and advantages thereof, may be best understood by reference to the following description taken in conjunction with the accompanying drawings, in the several figures of which like reference numerals identify like elements, and in which:

DESCRIPTION OF THE PREFERRED EMBODIMENT

Figure 1:
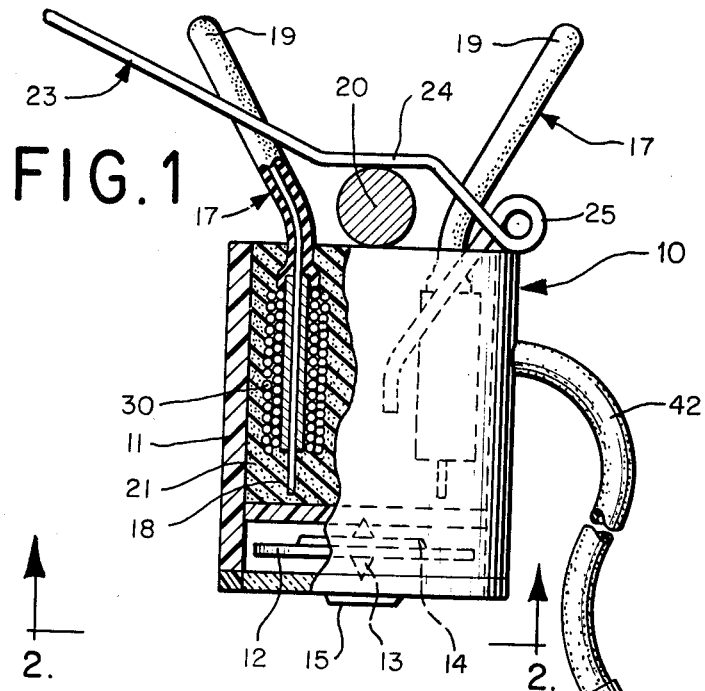
FIG. 1 is an elevational view, partially in section, illustrating a resettable fault indicator incorporating a cable for connection to an external excitation source in accordance with the invention.
Figure 2:
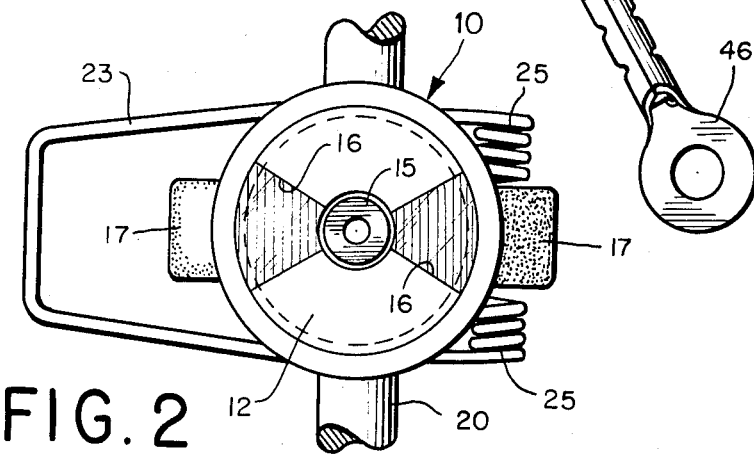
FIG. 2 is a top plan view of the fault indicator of FIG. 1.
Figure 3:
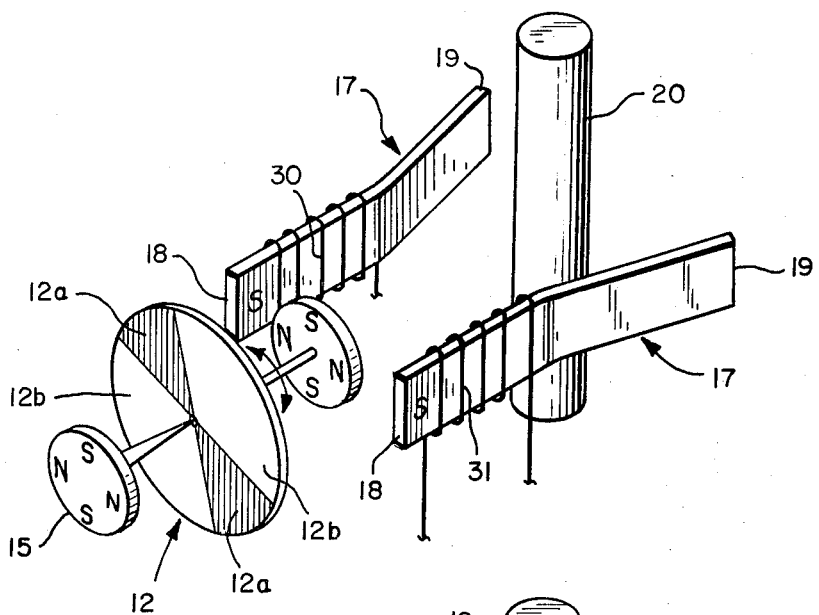
FIG. 3 is a simplified perspective view of the principal components of the fault indicator in a reset or non-fault indicating state.
Figure 4:
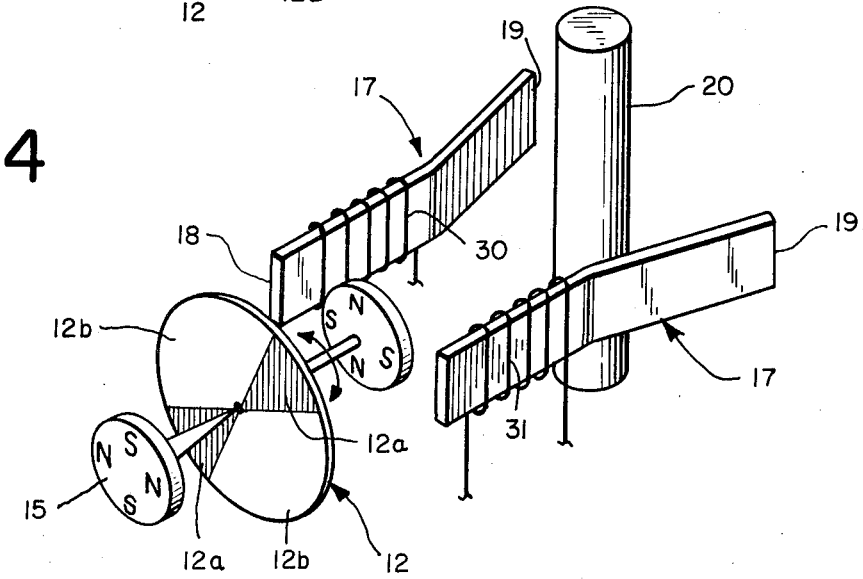
FIG. 4 is a simplified perspective view of the principal components of the fault indicator in a tripped or fault-indicating state.

Referring to the Figures, and particularly to FIGS. 1 and 2, a fault indicator 10 embodying the invention is seen to comprise an insulated cylindrical housing 11 within the lower end of which a disc shaped target 12 is mounted for rotation on a pivot 13. Secured to and pivotal with the target 12 is a target permanent magnet 14 which is magnetically polarized to form four poles, as indicated in FIGS. 3 and 4, with the same magnetic pluralities along diameters at right angles to each other. The target 12 and its permanent magnet 14 are biased to the position shown in FIG. 4 when the fault indicator is in a tripped position by means of a stationary permanent magnet 15 which is located at the lower end of the cylindrical housing 11. As shown in FIG. 2, only the white areas of target 12 are visible through windows 16 at the lower end of housing 11.

In order to bias target 12 and its permanent magnet 14 to the reset position shown in FIG. 3, the fault indicator includes a pair of pole pieces 17. The pole pieces are preferably formed of relatively low coercive force magnetic material, and are biased at their inner ends 18 and outer ends 19 to the polarities indicated in FIG. 3. When the fault indicator is installed on an electrical conductor 20, which may typically comprise the cable of a high voltage electrical distribution system operating, for example, at 8,000 volts and 60 hertz, the flared outer ends 19 of the pole pieces are located on opposite sides of the conductor 20. The inner ends 18 of the pole pieces extend along the sidewall of housing 11, as shown in FIG. 1, and are held securely in this position by a suitable potting compound 21.

The fault indicator 10 is held in position on conductor 20 by means of a generally U-shaped spring clamp 23. The clamp includes a central angled portion 24 for engaging conductor 20 and coil spring portions 25 at either end for biasing the central portion into engagement with the conductor. The ends of the spring clamp extend into potting compound 21 and are thereby held securely in position.

When the fault indicator is in a reset state, and the inner ends 18 of pole pieces 17 are magnetized to the magnetic polarities indicated in FIG. 3, the opposite polarity magnetic poles of the target magnet 14 are attracted to position the target as shown. In this position, the red segments 12a thereof are not visible through window 16, and all that is seen is one of the white background areas 12b of the disc. On the occurence of a fault current in conductor 20, which may, for example, exceed 400 amperes, the alternating magneting field generated around conductor 20 demagnetizes pole pieces 17 to the extent that the ends 18 thereof no longer are capable of biasing the target magnet 14 to the position shown in FIG. 3. As a result, the stationary permanent magnet 15, which like magnet 14 is magnetically polarized along diameters at right angles to each other, biases the target magnet 14 to the tripped or fault position shown in FIG. 4. In this position, one of the red segments 12a thereof is visible through window 16, and a lineman viewing the fault indicator is advised that a fault current has flowed through conductor 20. The target 12 remains in the fault indicating position shown in FIG. 4, until the inner ends 18 of pole pieces 17 are remagnetized to the magnetic polarities illustrated in FIG. 3.

After the fault condition has subsided, the fault indicator is automatically reset to a non-tripped or reset status by momentary energization of a pair of windings 30 and 31 located on respective ones of pole pieces 17. The magnetic flux induced in the pole pieces as a result of current flow in these windings is sufficient to restore the pole pieces to the magnetic state indicated in FIG. 3. As a result, the target magnet, and hence the target 12, are caused to rotate from the tripped position shown in FIG. 4 to the reset position shown in FIG. 3 and the fault indicator is conditioned to respond to a subsequent fault.

Figure 5:
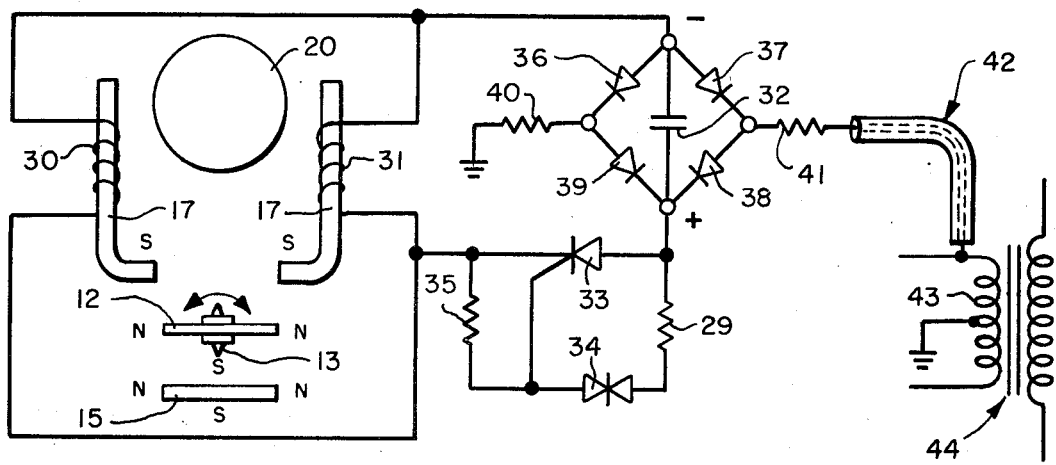
FIG. 5 is an electrical schematic diagram of the fault indicator.

Energization of windings 30 and 31 upon restoration of current in conductor 20 is accomplished by means of an externally-powered reset circuit contained within the fault indicator. Referring to FIG. 5, windings 30 and 31 are connected in this circuit in parallel for simultaneous energization by a capacitor 32 through a series-connected silicon controlled rectifier (SCR) 33. Conduction through SCR 33 is initiated by means of a bilateral diode 34 connected between the anode and gate electrodes of the SCR and a resistor 35 connected between the gate and cathode electrodes. With this arrangement, a current sufficient to trigger the SCR is applied to the gate electrode when the voltage across the anode and cathode electrodes rises to a level which exceeds the threshold level of bilateral diode 34. A resistor 29 connected in series with bilateral diode 34 limits current flow through the gate electrode.

Capacitor 32 is charged by means of a bridge rectifier network consisting of diodes 36-39. Capacitor 32 is connected between the negative polarity output terminal of this network, formed at the juncture of the anodes of diodes 36 and 37, and the positive polarity output terminal of the network, formed at the juncture of the cathodes of diodes 38 and 39. The negative polarity output terminal is also connected to windings 30 and 31, and the positive polarity output terminal is also connected to the anode of SCR 33 and to one end terminal of bilateral diode 34. As a result, capacitor 32 is charged by the bridge rectifier network, and upon triggering of SCR 33 discharges through windings 30 and 31.

One input terminal of the bridge rectifier network, formed at the juncture of diodes 36 and 38, is connected to ground through a resistor 40. This connection to ground may be conveniently established through retaining clip 23, which is of necessity in intimate contact with the electrically-conductive grounded outer surface of the high voltage cable. The other input terminal of the bridge rectifier network, formed at the juncture of diodes 37 and 39, is connected through a resistor 41 and flexible interconnecting cable assembly 42 to an external source of excitation, in this case the secondary winding 43 of a transformer 44 associated with the power distribution system of which conductor 20 is a part. Connection to the source of excitation may be established by a lug of appropriate size at the distal end of the cable assembly secured under the appropriate transformer terminal. With this arrangement, the lower voltage alternating current available at secondary winding 43 is applied through resistors 40 and 41 across the input terminals of the bridge rectifier network, causing that network to develop a unidirectional current for charging capacitor 32. The resistances of resistors 40 and 41 may be adjusted to compensate for variations in the resistance of cable 42 so that a desired predetermined series resistance is maintained between the excitation source and ground.

In operation, under normal current flow conditions, the voltage developed across capacitor 32 as the capacitor is charged by the bridge rectifier network progressively increases with time, until the threshold breakdown voltage of bilateral diode 34 is reached, at which time SCR 33 is triggered and capacitor 32 discharges through windings 30 and 31. In practice, the breakdown voltage of bilateral diode 34 may be in the order of 34 volts, and the time required for capacitor 32 to reach this threshold with a voltage level of 120 volts at winding 43 may be approximately two minutes. In any event, the voltage level at winding 43 is not critical to the operation of the reset circuit, and has only the effect of changing the length of time required for accomplishing the reset cycle.

In accordance with the invention, the electrical interconnection to the external excitation source is formed with a high impedance to reduce the possibility of a lineman receiving a dangerous electrical shock from inadvertant contact with the interconnecting conductor. Furthermore, the high impedance obviates the possibility of the secondary circuit of transformer 44 being affected by inadvertant grounding of the conductor, such as might happen from clamping or crimping of the interconnecting conductor.

In further accord with the invention, the interconnecting conductor assembly 42 is preferably formed of a length of neoprene rubber tubing 50. Within the lumen 51 of this tubing an electrically conductive coating 52 is formed from a mixture of uncured neoprene rubber and long-filiment carbon. A solvent such as toluene is added to this mixture to obtain an electrically conductive compound of liquid consistency which is caused to flow through the tubing. As the toluene solvent acts on the cured neoprene rubber inner walls of the tubing an integral electrically conductive coating is formed between the ends of the tubing segment. The resultant cable assembly is flexible and provides the desired high electrical impedance, typically in the order to two megohms for a three-foot section, evenly distributed over the entire length of the cable assembly.

Figure 6:
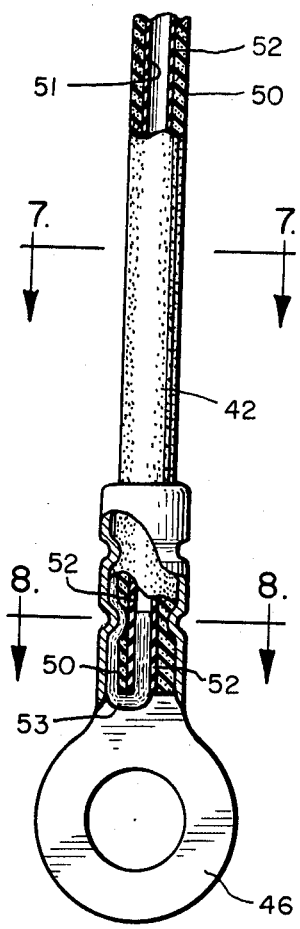
FIG. 6 is an enlarged top plan view of the power supply cable assembly of the fault indicator partially broken away and partially in section.
Figure 7:
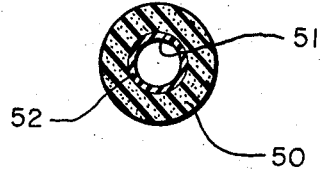
FIG. 7 is an enlarged cross-sectional view of the power supply cable assembly taken along line 6—6 of FIG. 6.
Figure 8:
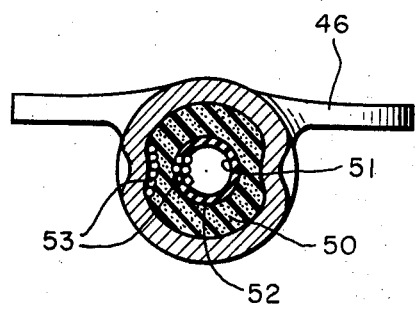
FIG. 8 is an enlarged cross-sectional view of the power supply cable assembly taken along line 7—7 of FIG. 6.

As shown in FIGS. 6–8, electrical connection may be conveniently made to the ends of the tubing segment by means of one or more U-shaped electrically conducting wires 53 which are folded over the ends of the tubing so as to form an electrically conductive bridge between the conductive coating 52 and the conductive body portion of an appropriate terminal 46. The body portion of the terminal may be crimped over these conductors to secure the terminal to the tubing segment and to provide a positive electrical connection to conductor 52.

In one commercially successful embodiment of the invention, interconnecting cable 42 was formed utilizing a tubing segment 50 formed of cured neoprene having a length of three feet, an outside diameter of 0.25 inches, and an inside diameter of 0.125 inches. The wall of the lumen of the tubing segment was coated with an electrically conductive coating by introducing into the tubing a liquid solution consisting of approximately 4% carbon powder, 6% neoprene rubber in liquid form, and 90% toluene solvent. A curing agent suitable for curing the uncured neoprene rubber at a temperature of approximately 300° F. is preferably included in the liquid rubber component, and the coated tubing segment is preferably baked at this temperature following draining and drying of the rubber and carbon mixture within the lumen.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A fault indicator operable from the relatively low voltage secondary circuit of a power distribution transformer for indicating the presence of a fault current in the relatively high voltage primary circuit of the transformer, said indicator including:

a housing;

externally-viewable circuit condition indicating means within said housing having a fault-indicating state and a reset-indicating state, said indicating means being operable from an applied excitation current;

means comprising an elongated flexible cable extending between said indicating means and the secondary circuit of the transformer for supplying excitation to said indicating means, said cable including an electrically conductive core portion forming an electrical path having a uniformly distributed impedance many times greater than that of said primary and secondary circuits between said indicating means at one end and said secondary circuit at the other end whereby said core portion, if shorted to ground, results in only an inappreciable current flow in said circuits; and an electrically insulating sleeve portion extending around and along said core portion between said housing at one end and said secondary circuit at the other end.

2. A fault indicator as defined in claim 1 wherein said indicating means include trip means responsive to the occurrence of a fault current in the primary circuit for conditioning said circuit condition indicating means to a trip state, and reset means operable from said secondary circuit for conditioning said indicating means to a reset state, and wherein said core portion connects to said reset means at said one end of said cable.

3. A fault indicator as defined in claim 1 wherein said sleeve portion comprises a segment of electrically insulating tubing and said core portion comprises an electrically conductive coating on the inside wall of said tubing segment.

4. A fault indicator as defined in claim 3 wherein said electrically conductive coating comprises a mixture of long-filament carbon particles and uncured rubber.

5. A fault indicator operable from the relatively low-voltage secondary circuit of a power distribution transformer for indicating the presence of a fault current in the relatively high-voltage primary circuit of the transformer, said indicator including:

a housing;

an indicator target mounted within said housing and moveable between a fault-indicating position and a reset-indicating position, said target being viewable from the exterior of the fault indicator;

magnetic positioning means for positioning said target in said reset position upon occurrence of a fault current in the conductor, and in said trip position upon restoration of normal current flow in the conductor, said positioning means being operable from an applied excitation current;

means comprising a flexible cable extending between said positioning means and the secondary circuit of the transformer for supplying excitation current to said positioning means, said cable including an electrically conductive core portion forming an electrical path having a uniformly distributed impedance many times greater than that of said primary and secondary circuits between said indicating means at one end and said secondary winding at the other end, whereby said core portion, if shorted to ground, results in only an inappreciable current flow in said circuits; and an electrically insulating sleeve portion extending around and along said core portion between said housing at one end and said secondary circuit at the other end.

6. A fault indicator as defined in claim 5 wherein said sleeve portion comprises a segment of electrically insulating tubing and said core portion comprises an electrically conductive coating on the inside wall of said tubing segment.

7. A fault indicator as defined in claim 6 wherein said electrically conductive coating comprises a mixture of long-filament carbon particles and uncured rubber.

8. In a fault indicator operable from the relatively low-voltage secondary circuit of a power distribution transformer for indicating the presence of a fault current in the relatively high-voltage primary circuit of the transformer, said indicator including a housing, an externally viewable circuit condition indicating means within said housing having a fault-indicating state and a reset-indicating state, said indicating means being operable from an applied excitation current, the improvement comprising:

means comprising a flexible cable extending between said indicating means and the secondary circuit source for supplying excitation to said indicating means, said cable including an electrically conductive core portion forming an electrical path having a uniformly distributed impedance many times greater than that of said primary and secondary circuits between said indicating means at one end and said secondary circuit at the other end, whereby said core portion, if shorted to ground, results in only an inappreciable current flow in said circuits; and an electrically insulating sleeve portion extending around and along said core portion between said housing at one end and said secondary circuit at the other end.

9. A fault indicator as defined in claim 8 wherein said sleeve portion comprises a segment of electrically insulating tubing and said core portion comprises an electrically conductive coating on the inside wall of said tubing segment.

10. A Fault indicator as defined in claim 9 wherein said electrically conductive coating comprises a mixture of long-filament carbon particles and uncured rubber.

11. A fault indicator operable from a remote low-voltage excitation source for indicating the presence of a fault current in a relatively high-voltage electrical conductor, said indicator including:

a housing;

externally-viewable circuit condition indicating means within said housing having a fault indicating state and a reset-indicating state, said indication means being operable from an applied excitation current;

means comprising an elongated flexible cable extending between said indicating means and the external excitation source for supplying excitation to said indicating means, said cable including an electrically conductive core portion forming an electrical path having a uniformly distributed impedance many times greater than that of said electrical conductor and said excitation source between said indicating means at one end and said source at the other end, whereby said core portion, if shorted to ground, results in only an inappreciable current flow from either said electrical conductor or said excitation source; and an electrically insulating sleeve portion extending around and along said core portion between said housing at one end and said excitation source at the other end.

12. A fault indicator as defined in claim 11 wherein said indicating means include trip means responsive to the occurrence of a fault current in the conductor for conditioning said circuit condition indicating means to a trip state, and reset means operable from said remote source of excitation for conditioning said indicating means to a reset state, and wherein said core portion connects to said reset means at said one end of said cable.

13. A fault indicator as defined in claim 11 wherein said sleeve portion comprises a segment of electrically insulating tubing, and said core portion comprises an electrically conductive coating on the inside wall of said tubing segment.

14. A fault indicator as defined in clam 13 wherein said electrically conductive coating comprises a mixture of long-filament carbon particles and uncured rubber.

15. In a fault indicator operable from a remote low-voltage excitation source for indicating the presence of a fault current in a relatively high-voltage electrical conductor, said indicator including a housing, and externally-viewable circuit condition indicating means within said housing having a fault-indicating state and a reset-indicating state, said indicating means being operable from an applied excitation current, the improvement comprising;

means comprising a flexible cable extending between said indicating means and said external excitation source for supplying excitation to said indicating means, said cable including;

an electrically conductive core portion forming an electrical path having a uniformly distributed impedance many times greater than that of said electrical conductor and said excitation source between said indicating means at one end and said source at the other end, whereby said core portion, if shorted to ground, results in only an inappreciable current flow from either said electrical conductor or said excitation source; and an electrically insulating sleeve portion extending around and along said core portion between said housing at one end and said excitation source at the other end.

16. A fault indicator as defined in claim 15 wherein said sleeve portion comprises a segment of electrically insulating tubing, and said core portion comprises an electically conductive coating on the inside wall of said tubing segment.

17. A fault indicator as defined in claim 16 wherein said electrically conductive coating comprises a mixture of long-filament carbon particles and uncured rubber.

* * * * *